United States Patent [19]

Patridge et al.

[11] Patent Number: 5,121,188
[45] Date of Patent: Jun. 9, 1992

[54] LASER MODULE ASSEMBLY

[75] Inventors: William C. Patridge, Grants Pass; Adam J. Reed, Ashland; Robert R. Kelly, Merlin; Michael W. Becker, Eagle Point, all of Oreg.

[73] Assignee: Applied Laser Systems, Grants Pass, Oreg.

[21] Appl. No.: 524,152

[22] Filed: May 16, 1990

[51] Int. Cl.$^5$ .................. H01L 23/04; H01L 23/06; H01L 25/04
[52] U.S. Cl. .......................... 357/74; 357/75
[58] Field of Search ............... 372/101, 109, 94, 97; 357/74, 75

[56] References Cited

U.S. PATENT DOCUMENTS

| | | | |
|---|---|---|---|
| 4,541,689 | 9/1985 | Howard et al. | 350/255 |
| 4,678,288 | 7/1987 | Lonsdale et al. | 350/432 |
| 4,694,182 | 9/1987 | Howard | 250/566 |
| 4,731,795 | 3/1988 | Clark et al. | 372/101 |
| 4,884,275 | 11/1989 | Simms | 372/9 |
| 4,897,850 | 1/1990 | Crosby | 372/109 |
| 4,910,741 | 3/1990 | Pillsburg et al. | 372/109 |
| 4,916,579 | 4/1990 | Simms | 362/18 |
| 4,916,713 | 4/1990 | Gerber | 372/109 |

Primary Examiner—Rolf Hille
Assistant Examiner—S. V. Clark
Attorney, Agent, or Firm—William S. Lovell; Alexander C. Johnson, Jr.

[57] ABSTRACT

A self-contained laser module assembly has a diode laser and driver circuit enclosed with a cylindrical metal housing which forms a first electrical contact for inputting a DC voltage to power the circuit and laser. The housing has a first end which includes a lens positioned to emit a collimated laser beam along an axis of the housing and a second end including a second external electrical contact positioned to contact the power supply. One application of the module is in a pen-like pointer. The pointer includes conductive cap and body portions which are threaded together to house a laser module and a battery in end-to-end relationship. An O-ring between the battery and the body or module is axially compressed by tightening the cap on the body to enable turning on the pointer. The cap has a pocket clip through which electrical contact is selectably made between the body and a side contact on the module to cause a beam to be emitted.

23 Claims, 6 Drawing Sheets

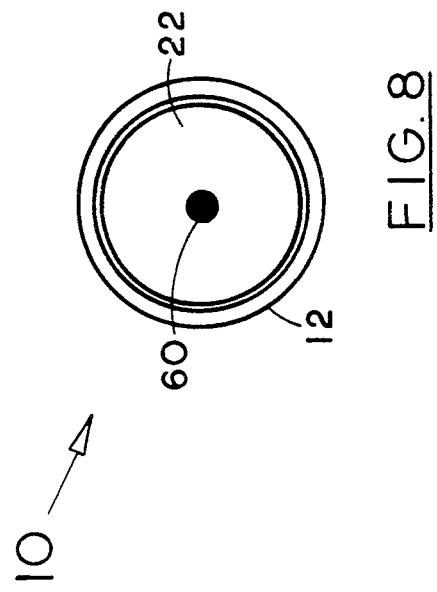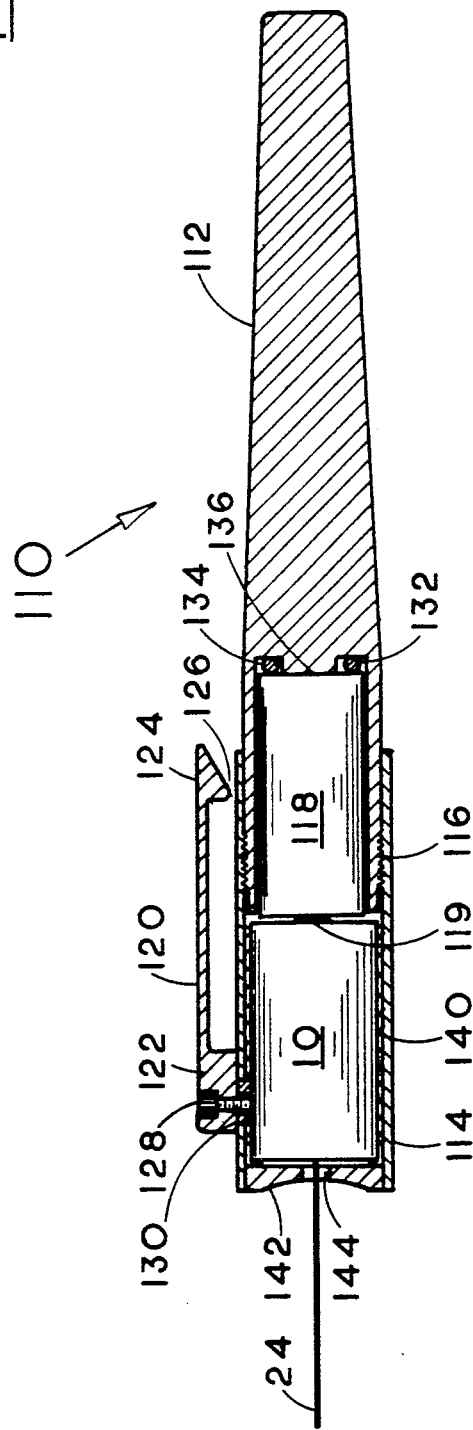

LASER MODULE ASSEMBLY

This invention relates to a modular light source and more particularly to a self-contained visible laser module assembly for general applications having a collimated output beam that is axially aligned with the physical structure of the module.

BACKGROUND OF THE INVENTION

Diode lasers have come to be used in a wide variety of applications. Typically, diode lasers are packaged without driver circuitry in what is commercially known as a TO5 package, disclosed is U.S. Pat. No. 4,768,070, having three pins which are inserted into a mounting socket. For each application, the TO5-packaged diode laser and supporting circuitry are designed and packaged in a custom fashion in housing uniquely suited to the application. Known applications fall into three general categories.

The first category includes various cabinet-housed electronics systems, such as compact disc players and optical storage units. The laser light source, driver circuitry and optics are loosely dispersed within the housing and interconnected and powered by open wiring. These systems are neither rugged nor waterproof.

The second category includes special-purpose hand-held devices that include a laser light source, such as bar code scanners. U.S. Pat. No. 4,387,297 discloses an example of such an application that employs a He/Ne gas laser. Suggestion is also made to use a diode laser but its implementation is not described. One problem, to which U.S. Pat. No. 4,601,452 describes an unduly complex solution, is the difficulty of beam alignment with laser diodes because of variations in beam divergence. Although sufficiently compact and durable for hand use, these devices are not suitable for general use as a module or component in other systems. Many of such type have an external cable connection to the drive and control circuitry needed for their use. Those that have self-contained circuitry are not adaptable to rugged use or an adverse environment. They are not themselves sufficiently compact to serve as a module or component of another system. They are particularly unsuited for portable outdoor applications, such as an aiming system mounted on a rifle or pistol, which require a rugged, water-proof light source.

A third type of application is in the fiber optics area. In such systems, it is conventional to mount the laser diode in a DIP module which is plugged into a circuit board and connected to an optical fiber. These designs are intended for fixed installations to couple to an optical fiber. The circuit board with diode laser mounted thereon not suitable for use as a general-purpose module or component in portable applications requiring both ruggedness and water-resistance. Such applications are disclosed in, e.g., U.S. Pat. Nos. 3,840,889; 4,803,689; 4,752,109; 4,834,491 and 4,722,586.

A need remains for a compact, self-contained laser light source which can be used as a general-purpose component in systems, is rugged and water-resistant, and can be readily powered and controlled.

SUMMARY OF THE INVENTION

One object of the invention is to modularize a diode laser light source, together with its supporting circuitry, into a compact, self-contained package.

Another object is to package the module, in a way that is rugged and water-resistant, and so that it is useful for a wide range of applications and can be readily powered from a conventional external source.

A further object is to miniaturize the module so that it can be readily incorporated as a component into various hand-held devices, such as pointers, small firearms, cameras, and the like.

The invention is a miniature visible laser module comprising a metal housing having an externally cylindrical shape, an inner cavity and first and second opposite axial end openings, a lens and means for mounting the lens in the first end opening, and means for closing the second end of the cavity. A diode laser is mounted in a first portion of the cavity of the housing adjacent a rear side of the lens. A laser driver circuit is mounted within a second portion of the cavity of the housing. The laser and lens are arranged to emit a beam substantially along the axis of the housing.

The module includes first and second contact means for coupling opposite polarity electrical potentials from an external direct current voltage source, such as a battery, to the drive circuit and diode laser. Preferably, the metal housing itself, or a portion thereof, is electrically coupled to one polarity of the drive circuit and diode laser to serve as the first contact means, and the means for closing the second end of the cavity includes an external conductive portion insulated from the metal housing and independently connected to the drive circuit to serve as the second contact means.

The first portion of the cavity preferably includes an inward projecting annular shoulder and the diode laser package includes an annular flange spacing the laser a predetermined distance from the first end. The means for mounting the lens is axially-adjustable to focus the laser beam through the lens, and can further be adjustable to center the beam along the housing axis. Electrical contact can also be made from the metal housing to the annular flange of the laser package.

One application of the module is in a pen-like pointer. The pointer includes metal cap and body portions which are threaded together to house a laser module and a battery in end-to-end relationship. An O-ring positioned axially between the body and the battery is axially compressed by tightening the cap on the body to provide one contact means to the module. Alternatively, the O-ring can be positioned between the battery and the module. The module is preferably insulated from the body and cap of the pointer, e.g., by an insulative layer. The cap has a pocket clip through which a second electrical contact is selectably made between the body and the first contact on the side of the module to cause a beam to be emitted.

The foregoing and other objects, features and advantages of the invention will become more readily apparent from the following detailed description of a preferred embodiment which proceeds with reference to the accompanying drawings.

BRIEF DESCRIPTION OF THE DRAWINGS

FIG. 8 is a rear end elevation view of an alternative embodiment of the module of FIGS. 1-4.

FIG. 9 is an axial sectional view of a hand-held pointer incorporating a module according to one application of the invention.

DETAILED DESCRIPTION

Figure 2:
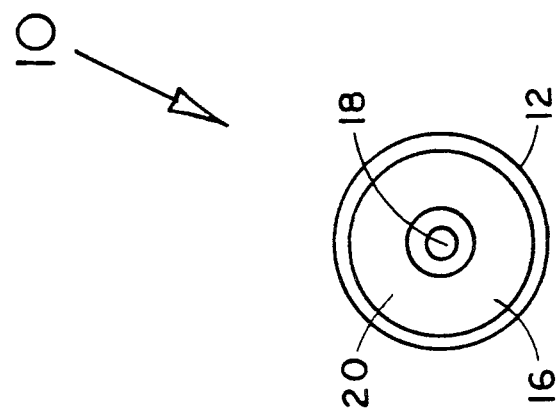
FIG. 2 is a front end elevation view of the module of FIG. 1.
Figure 1:
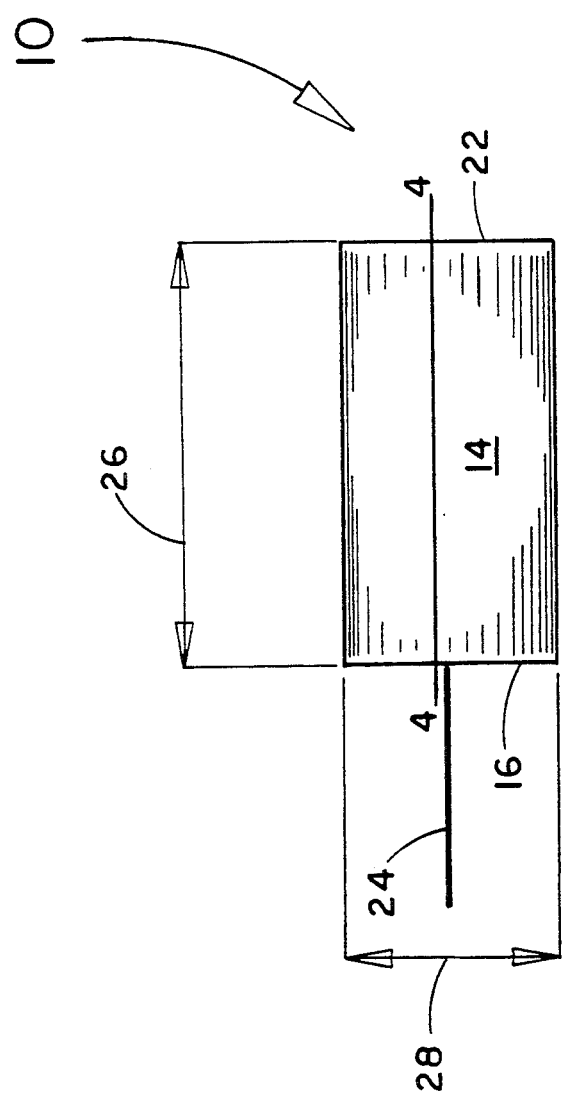
FIG. 1 is a side elevation view of a visible laser module according to the invention.
Figure 3:
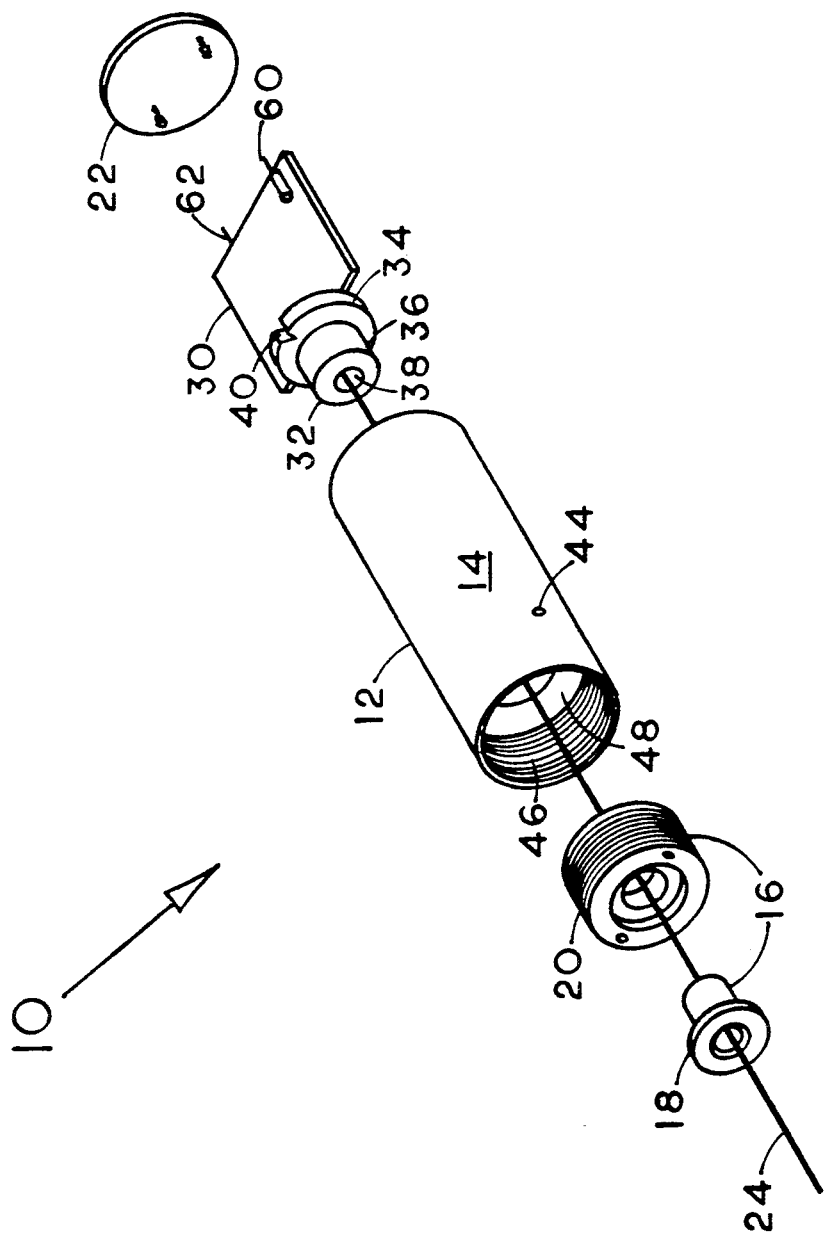
FIG. 3 is an exploded frontal perspective view of the module of FIGS. 1 and 2.
Figure 4A:
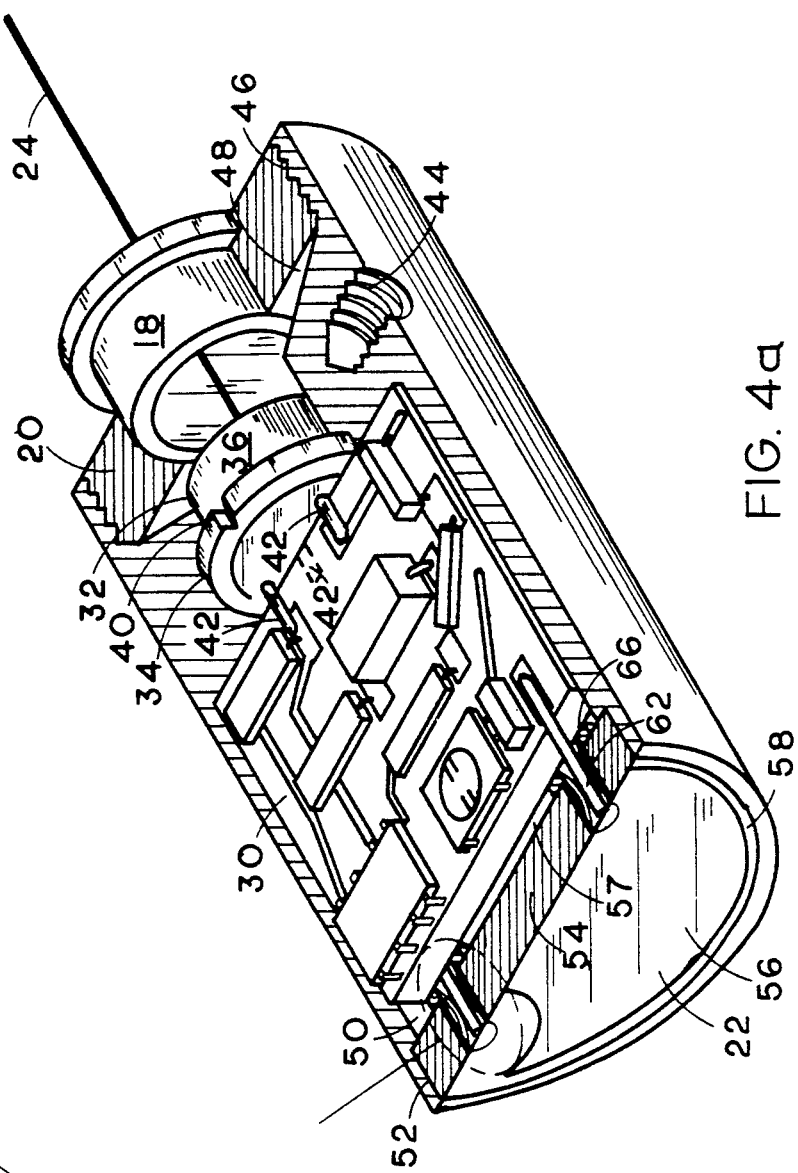
FIG. 4a and 4b are rear perspective views of a cross section of the module taken along lines 4-4 in FIG. 1.
Figure 4B:
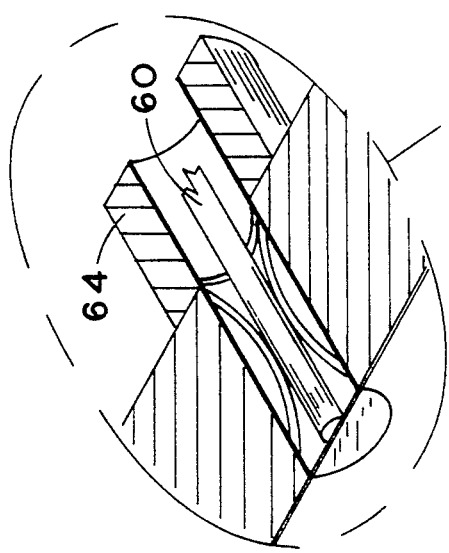

Referring to FIGS. 1 and 2, a preferred embodiment of a visible laser module 10 according to the invention has a metal housing 12 with a cylindrical external sidewall 14, a front end wall 16 which includes an axially-positioned lens 18 and an adjustable annular mounting ring 20, and a rear wall 22, best seen in FIGS. 3 and 4. A diode laser, lens and all necessary timing and drive circuitry, further described below, are integrated within the housing to form a fully self-contained compact module. The sidewall, front wall and rear wall structures are sealed as described below to provide a rugged, waterproof module. This module is arranged to be externally powered by a battery or other 5 to 10 VDC power source. In operation, the module emits a visible collimated elliptical light beam along axis 24, which can selectably be pulsed (10 Hz, 50% duty cycle) or continuous. In one example of the preferred embodiment, the cylindrical module has a length 26 of 1.125 inch (28.6 mm.) and a diameter 28 of 0.580 inch (14.7 mm.).

The structure and sequence of assembly of the module are further detailed with reference to FIGS. 3 and 4. In the assembled module shown in FIG. 3, the housing 12 encloses a miniature rectangular printed circuit board 30. A laser diode light source 32 is mounted on one edge of the printed circuit board in position to emit a beam substantially along axis 24 which is substantially coplanar with board 30. The preferred light source is a laser diode, e.g., a model TOLD 9211 manufactured by Toshiba or a model NDL 3200 manufactured by NEC, which produces a deep red (wavelength 665-675 nm.) beam of elliptical cross section with a divergence of approximately 35 degrees and 17 degrees at the half-power points along the major and minor axes. The light source 32 is mounted on a metal disk which forms a thermally and electrically conductive flange 34 and has a concentric cylindrical cap 36 with a circular Kover glass beam outlet opening 38. The major axis of the beam is generally indicated by a pair of diametrically opposed notches 40 on the periphery of the flange.

The light source 32 has three leads protruding rearward through the flange. The leads are precut to length and soldered to appropriate bonding pads on the board 30 (see discussion of FIGS. 6 and 7 below). Two leads 42 are connected to the rear surface of the printed circuit board and the third, positive-potential lead is connected to the front surface. The light source is oriented so that notches 40 (and thereby the major axis of the beam) are orthogonal to the plane of the board. The board, in turn, is aligned coplanarly with the axis of a radial screwhole 44 formed in the side of the housing for use in mounting the module. The screwhole thus generally indicates the orientation of the emitted elliptical beam.

The housing 12 is machined about axis 24 of a conductive noncorroding metal. It is formed with an internally-threaded front end opening 46, an internal annular shoulder 48, and a rear compartment 50 with a rear opening 52 of a diameter slightly larger than that of the rear compartment. The screwhole 44 is axially aligned with internal shoulder 46 and drilled to a depth less than the radial thickness of shoulder 46 so as not to admit water to the interior of the housing.

The printed circuit board 30 and laser light source 32 are inserted as a unit into the rear compartment which is sized to a diameter to receive the printed circuit board in an interference fit. The internal shoulder 48 is positioned axially to support the cap 36 and flange 34 of the light source 32 at a predetermined spacing from the threaded front opening, as further discussed below. The circuit board 30 is aligned as described above and is affixed internally by applying epoxy between its edges and the inner surface of the rear compartment.

The rear wall structure 22 is provided by a circular printed circuit board having a dielectric core 54 with rear and front metallic cladding layers 56, 57. The core is sized to a diameter that forms a press fit into rear opening 52. The rear cladding layer 56 is patterned to provide an insulative margin between the cladding edge and the sidewall of the housing. In one embodiment of the module, the rectangular printed circuit board 30 has a negative pin 60 and a positive pin 62 which protrude rearward from the rear edge of board 30. A pair of diametrically spaced sockets 64, 66 are formed in rear wall structure of board 22 for receiving pins 60, 62, respectively. The front cladding layer 57 is patterned to provide electrical continuity from positive pin 62 and socket 66 to the inner sidewall of housing 12.

After insertion of the rectangular board 30 and light source 32 into the rear compartment 50, the pins 60, 62 are cut off flush with the rear edge of the housing 12. The circular board 22 is then press-fitted into the rear opening 52, with pins 60, 62 extending through single-pin sockets 64, 66 and front cladding layer 57 which is electrically coupled to housing 12. The sockets are of a conventional type which provides a waterproof fit around the pin. The negative pin 60 is then coupled electrically to the cladding layer 56 by soldering socket 64 to the rear cladding layer. The negative pin 60 is isolated electrically from the front cladding layer 57 by patterning the cladding layer with an annular opening around socket 64. The positive pin 62 is isolated likewise from the rear cladding layer by patterning the layer 56 with an annular opening 68 around socket 66.

Next, lens 18 is installed in the lens mounting ring 20. The mounting ring is externally threaded to fit in the front opening 46 and has a smooth concentric central opening. The lens 18 has a cylindrical base portion which is sized to be received in the central opening of the mounting ring and a frontal flange which rests on the mounting ring. The lens is centered in the mounting ring and then glued in place, using a glue that makes this joint waterproof. The lens structure 16 is then mounted, aimed and collimated. It is mounted by screwing the mounting ring into the front opening. A wicking-type waterproof adhesive is applied to the threads to seal and to set the lens structure in the position determined as next described.

As mentioned above, the internal shoulder of the housing is positioned to space the light source a predetermined distance from the front opening. Specifically, the rear side of the internal shoulder is positioned so as to locate the focal plane of the laser light source within the range of travel of the mounting ring in the threaded front opening. The preferred lens is a SELFOC TM plano-convex lens of a type sold by NSG America Inc. for use, e.g., in optical pick-up systems for compact disc and optical disc record and playback systems, with the convex side of the lens collecting divergent energy from the laser diode to produce a point-focused beam. This lens has a working distance of about 1.9 mm.

As used in the present invention, the planar face of the lens 18 faces the light source and is positioned axially to produce a collimated beam along axis 24. The nominal distance between the emitting face 38 of the light source 32 and the facing planar surface of the lens is 2.1 mm. but the exact spacing is determined experimentally as discussed below. The output beam of laser diode 32 as manufactured is not necessarily coaxial with its gross mechanical axis, so the beam may be off aim. Therefore, the threads of the mounting ring are made loose enough to permit a sufficient amount of tilt and offset of the lens structure to compensate for as much as 3 degrees of beam offset from the physical axis of the laser light source structure. The beam is aimed, to align it with axis 24, by placing the module housing in a clamp and then manipulating the mounting ring and lens as a unit in the threads until the beam falls within a prescribed area on a target indicated by a video camera. The emitted beam is transmitted down a darkened tunnel with a target (not shown) at the end, and the camera is mounted alongside the module and aimed at the target area so that an operator can see both the beam and target on the camera monitor. The beam is collimated by screwing the lens structure 32 in or out to locate the focal plane, i.e., the beam as seen by the video camera appears focused. The aiming and collimation steps can be performed in either order or simultaneously.

In a second embodiment, a number of changes are made in the above-described structure and assembly in regard to forming a continuous electrical circuit between the housing and the positive-potential input of the laser light source 32. The second embodiment omits the positive pin 62 and socket 66, and can dispense with the rear and front cladding layers 56, 57. Instead, continuity is established directly between the light source flange 34, which is electrically coupled to the positive-potential pin, and the housing. A bead of conductive epoxy is applied along the interfacing surfaces of the flange 34 and the internal shoulder of the housing to assure this continuity. Socket 64 can also be omitted, and the end of negative pin 60 merely protrudes through the center of rear wall 22 as shown in FIG. 9. The protruding end of pin 60 can be conveniently capped with solder to assure sufficient electrical contact. A bead of epoxy is applied between the periphery of the circular printed circuit board and the rear opening 52 to assure water resistance of the rear wall structure 22.

Figure 5:
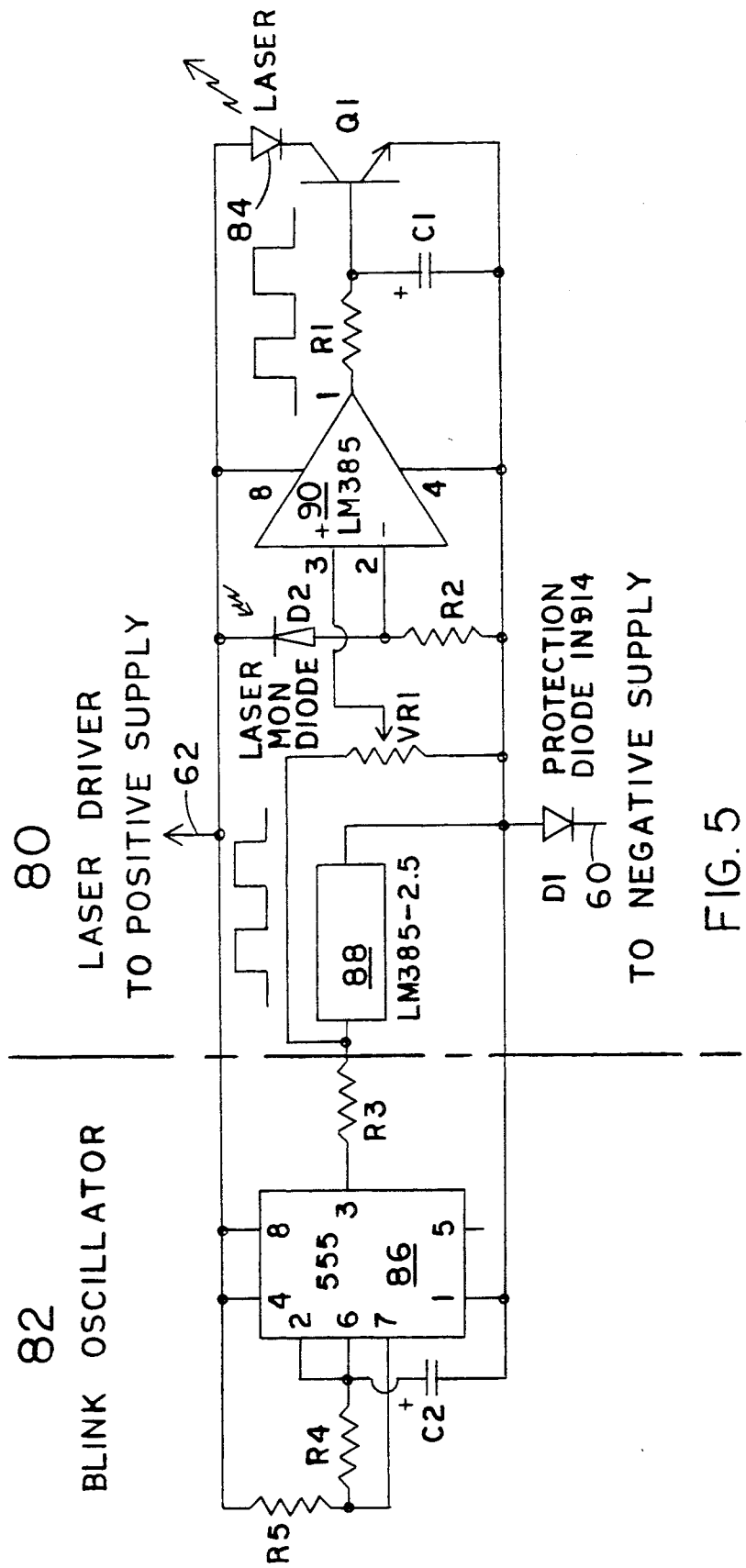
FIG. 5 is an electrical schematic diagram of the laser module printed circuit board of the module of FIGS. 1-4.

Referring to FIG. 5, the laser driver circuit on board 30 is of conventional design and includes a laser driver subcircuit 80 and a blink oscillator subcircuit 82. In subcircuit 80, the laser diode 84 is coupled in series with the collector of a bipolar transistor Q1 (Type 2N3904) which has its emitter coupled through a protection diode D1 (Type 1N914/BAT54) to the negative power supply pin 60. The laser diode has its cathode coupled to the positive power supply either via pin 62 or via the flange 34 of the light source 32. Transistor Q1 has its base coupled to drive circuitry controlled by the blink oscillator subcircuit.

The blink oscillator subcircuit 82 includes a timer 86 (Type 555) with its control inputs coupled to the negative and positive supply voltages in conventional fashion through an RC network composed of two resistors R4 (47 kohm) and R5 (4.7 kohm) and a capacitor C2 (1 mfd) to produce an output square-wave signal through resistor R3 (4.7 kohm) having a frequency of 10-12 Hz. A continuous wave embodiment can be made by shorting the input to the timer (pins 2 or 6) to ground (the positive supply 62).

The square-wave signal is input to the driver subcircuit 80, where it provides bias voltage to a 2.5 volt reference circuit 88 (Type LM .385) and passes through a 50 kohm potentiometer VR1 configured as a voltage divider. The output of the voltage divider is input to the noninverting input of an operational amplifier 90. The amplifier has an inverting input connected to a node between a resistor R2 and a laser monitor diode D2 which are coupled in series between the positive and negative supply voltages. Resistor R2 serves to convert the current output of the monitor diode to a voltage. The output from the amplifier is a square-wave signal which is transmitted through a resistor R1 and shunt capacitor C1 (0.47 mfd) to the base of transistor Q1 to cause the transistor to turn the laser diode 84 on and off at 10 to 12 Hz. The amplifier is configured as a voltage comparator. Thus, its output is maintained so as to hold the voltage derived from the current output of the monitor diode equal to the reference voltage set by the potentiometer VR1. The net result is to hold the optical output power of the laser diode constant.

Figure 7:
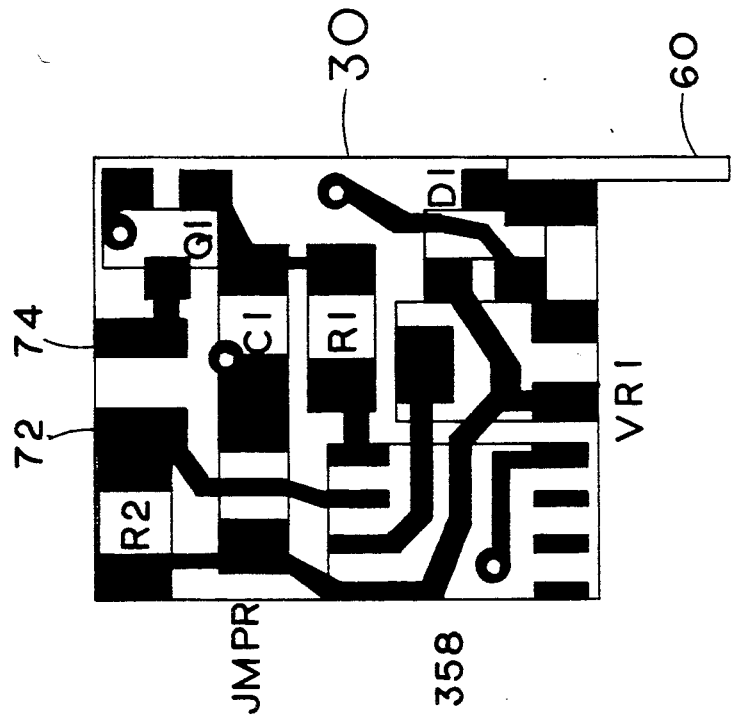
FIGS. 6 and 7 are front and rear plan views of the printed circuit of FIG. 5.
Figure 6:
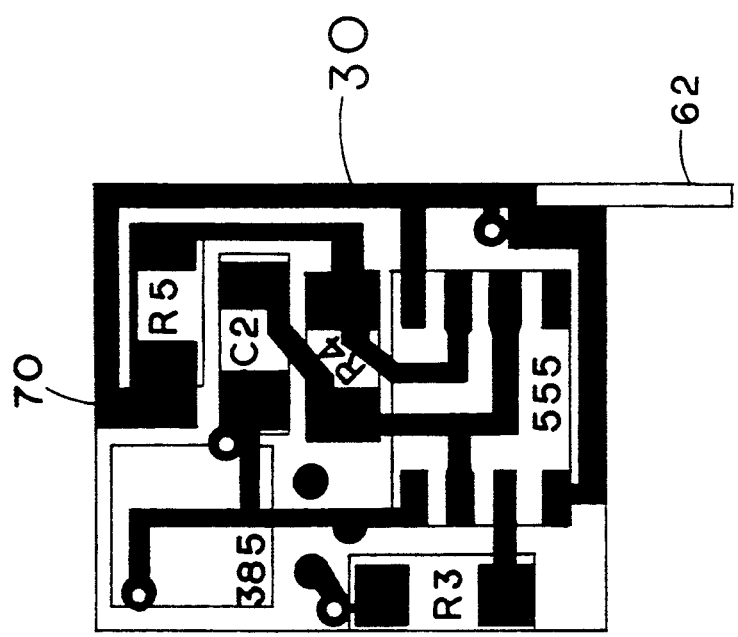

The foregoing circuit is laid out and its components are surface-mounted on both sides of printed circuit board 30 as shown in FIGS. 6 and 7, which is sized to fit within rear compartment 50 of housing 12. The laser is mounted on the edge of printed circuit board 30 with flange 34 perpendicular to the plane of the printed circuit board and its three leads 42 positioned to straddle the thickness of board 30, which is typically about 1/32 inch (1 mm.) thick. The ground (or positive) lead is soldered to a pad 70 centered along the forward edge of the front side of the board as shown in FIG. 6. The other two leads are soldered to appropriately positioned, spaced-apart pads 70, 72 on the rear side of board 30 as shown in FIG. 7. Pins 60, 62 are similarly mounted along the rearward edge of board 30. In the above-mentioned alternative embodiment, positive pin 62 is omitted and pin 60 is centered between the side edges of the board.

There are many possible applications for the module 10. One novel implementation is in a hand-held visible laser beam pointer 110, as shown in FIG. 9. Such a pointer has a cylindrical casing sized to be held in a user's hand and pocket. The casing includes a conductive cylindrical body portion 112 and a conductive cap portion 114 received and secured on the body portion by means of threads 116.

The body and cap portions 112, 114 are preferably made of aluminum for lightness as well as conductivity, but other metals are suitable, as well. Such portions can also be made with a nonconductive coating that has a conductive surface exposed in regions where an electrical interconnection is required, such as threads 116. Alternatively, parts of the cap and body portions that need not be conductive can be made of a nonconductive material, such as molded plastic and other parts, such as parts that include threads 116, can be made of a conductor.

A conventional 7.5 volt mercury battery 118 (e.g., Type TR-175) is housed in a compartment sized and shaped therefor in the body portion 112. The battery has a negative terminal or contact 119.

A module 10 as above-described is mounted within the cap portion 114 of the casing. Its forward end 16, which includes lens 18 for emitting a collimated laser beam substantially along axis 24 (See FIGS 1 and 2), is positioned at the top end of the cap portion, opposite threads 116. The opposite or rearward end 22 of the module is positioned for cladding layer 56 (FIG. 4) or negative pin 60 (FIG. 8) to contact the negative terminal 119 of the battery. Terminal 119 is positioned and shaped to protrude axially from the threaded end of the body, thereby forming a surrounding annular gap with the cladding layer or negative pin. Alternatively, contact 119 can be flat and the module can have a central axially-protruding contact, such as a solder drop on pin 60 (FIG. 9), which makes contact across the axial gap.

A conductive metal clip 120 is mounted on the cap portion for retaining the pointer in a user's pocket in conventional manner. This clip is also arranged, however, so that the user can turn the beam on and off by manipulating the clip. The clip includes a base portion 122 and an elongated tip portion 124 which is normally spaced from the side of the cap at air gap 126. A screw 128 is threaded into hole 44 (FIG. 4) in the side of the module to mechanically and conductively connect the base 122 of the clip to the conductive module housing 12. An insulative washer 130 connects the base 122 of the clip 120 nonconductively to the cap portion 114. Alternatively, the upper part of the cap above threads 116 can be made of or coated with a nonconductive material, which will serve the insulative function of the washer. The screw and washer are arranged to bias the tip portion 124 of the clip resiliently out of contact with the cap portion at gap 126.

The body portion is formed to provide an annular channel 132, which contains a compressible elastomeric O-shaped ring 134. The channel and ring concentrically surround an internal casing contact 136 positioned in juxtaposition with the positive polarity terminal of battery 118. Ring 134 is sandwiched between the casing contact and the positive terminal and has an uncompressed thickness (e.g., 2 mm.) greater than the depth of the channel (e.g., 1 mm.). The ring also has a length that is shorter (e.g., by about 3 mm) than the circumference of the channel. This arrangement permits electrical contact between the battery and the casing when the cap is tightened sufficiently to compress the ring 134. Conversely, the ring urges the battery away from contact 136 to break that connection when the cap portion is loosened.

Alternatively, the O-ring 134 can be positioned between the battery and module 10, concentrically with terminal 119 and the contact 60 on the rear panel of the module, and the annular channel 132 can be omitted.

The cap portion has an insulative sleeve or surrounding layer of insulative adhesive tape 140 which surrounds the metal housing 12 of laser module 10 so that contact to the cap is made only through screw 128. Alternatively, the interior surface of the cap 114 can be coated with an insulative material above threads 116. Furthermore, the exterior of the cap and of housing 112 can be coated with insulative material, except at airgap 126 and threads 116. The cap has a circular top end wall 142 with a concentric opening 144 sized and positioned to emit a beam along axis 24. The end wall can be formed as a unitary part of the remainder of cap 114 or can be formed separately. The cap can alternatively be formed of an upper part which is nonconductive (e.g., plastic) and a lower conductive collar which includes threads 116 and the contact area for tip 124. Other variations in construction are also possible.

Because the clip 120 is insulated from cap 114 by washer 130 and air gap 126, the module remains normally off even when the cap is tightened so as to establish continuity between the module, the battery terminals and the casing. The module is readily actuated by the user depressing the tip portion into contact with the cap portion, closing gap 126. Conversely, when the cap is loosened to break continuity between the module, the battery terminals and the casing, pointer 110 can be carried about in the user's pocket or briefcase without worry that the clip may be accidentally depressed so as to turn on the laser beam and run down the battery.

Having described and illustrated the principles of our invention a preferred and several alternative embodiments thereof, it should be apparent that the invention can be varied in arrangement and detail without departing from such principles. Diode lasers of varying wavelength could be substituted, including those in the infrared range, such as the Sharp LTO15MDO at 830 nm. or generally in the 630–850 nm. range. We claim all modifications and variations coming within the spirit and scope of the following claims.

We claim:

1. A miniature unitary laser module comprising
   a metal housing having an externally cylindrical shape, an inner cavity and first and second opposite axial end openings;
   a lens and means for mounting the lens in the first end opening;
   a diode laser mounted within a first portion of the cavity of the housing adjacent a rear side of the lens;
   a laser driver circuit mounted within a second portion of the cavity of the housing;
   first and second contact means for coupling opposite polarity electrical potentials from an external direct current voltage source to the driver circuit and diode laser to cause the diode laser to emit a beam through the lens; and
   means for closing the second end of the cavity, said means including
      an external conductive portion insulated from the metal housing and independently connected to the drive circuit to serve as the first contact means, and
      an external portion of the metal housing electrically coupled to one polarity of the drive circuit and diode laser to serve as the second contact means.

2. A module according to claim 1 in which the means for closing the second end is a printed circuit board having a first conductive layer formed on the external surface thereof in isolation from the metal housing and the drive circuit includes a conductor extending through the printed circuit board to the first conductive layer to form the first contact means.

3. A module according to claim 2 in which the printed circuit board includes a second conductive layer formed on the internal surface thereof in contact with the metal housing and the drive circuit includes a conductor extending to the internal surface of the printed circuit board to the second conductive layer to form the second contact means.

4. A module according to claim 2 in which the second end opening and printed circuit board are circular and mutually sized to form a press fit interconnection.

5. A module according to claim 1 in which the laser driver circuit is formed on a rectangular, planar first printed circuit board and the diode laser is mounted on an edge of the first circuit board in an orientation such that the laser beam axis is substantially coplanar with the first circuit board.

6. A module according to claim 5 in which the diode laser is centered between opposite lateral edges of the first circuit board.

7. A module according to claim 5 in which the driver circuitry includes components that are surface-mounted on both sides of the first circuit board.

8. A module according to claim 5 in which the metal housing includes an external fastener and the first circuit board is positioned in a predetermined circumferential positioned relative to the fastener.

9. A module according to claim 8 in which the laser beam is noncircular, having a major axis, and the major axis is aligned in a predetermined orthogonal relationship to the plane of the first circuit board.

10. A module according to claim 5 in which the means for closing the second end is a second printed circuit board having a conductive layer formed on the external surface thereof in isolation from the metal housing and the first circuit board includes a conductive pin extending coplanarly from a rearward edge thereof through the second printed circuit board to contact the conductive layer.

11. A miniature unitary laser module, comprising
   a metal housing having an externally cylindrical shape, an inner cavity and first and second opposite axial end openings;
   a lens and means for mounting the lens in the first end opening;
   a diode laser mounted within a first portion of the cavity of the housing adjacent a rear side of the lens;
   a laser driver circuit mounted within a second portion of the cavity of the housing;
   means for closing the second end of the cavity; and
   means for applying external power to the laser driver circuit to cause the diode laser to emit a beam through the lens;
   the first portion of the cavity including an inward projecting annular shoulder and the laser diode including an annular flange contacting one axial side of the annular shoulder to space the diode laser a predetermined distance from the first end.

12. A module according to claim 11 in which the means for mounting the lens is axially-adjustable to focus the laser beam through the lens.

13. A module according to claim 11 in which the means for mounting the lens includes a mounting ring which is axially-threaded so as to be adjustable to focus the laser beam through the lens.

14. A module according to claim 13 in which the axially-threading of the mounting ring is sufficiently loose to be tiltable within a range that permits adjustment of the axial position of the laser beam.

15. A module according to claim 14 in which the axially-threading of the mounting ring is sealed to waterproof the first opening.

16. A module according to claim 13 in which the axially-threading of the mounting ring and the interface of the lens and mounting ring are sealed to provide a waterproof closure of the first opening.

17. A module according to claim 11 in which the annular shoulder of the housing and the annular flange of the diode laser are conductive and conductively contact one another, the annular flange being coupled to one electrical polarity in the drive circuit, so that an electrical potential can be applied to the circuit through the housing.

18. A module according to claim 17 in which the annular shoulder of the housing and the annular flange of the diode laser are interconnected by a conductive glue.

19. A miniature unitary laser module, comprising:
   a housing having an externally cylindrical shape, an inner cavity and first and second opposite axial end openings;
   a lens and means for mounting the lens in the first end opening;
   a back panel closing the second end of the cavity;
   a diode laser mounted within a first portion of the cavity of the housing adjacent a rear side of the lens;
   a laser driver circuit formed on a rectangular, planar printed circuit board mounted within a second portion of the cavity of the housing; and
   means for applying external power to said laser driver circuit;
   the diode laser being mounted on a forward edge of the circuit board in an orientation such that the laser beam axis is substantially coplanar with the circuit board.

20. A module according to claim 19 in which the diode laser has a base portion which is substantially perpendicular to the laser beam axis and the base portion includes three electrical contact leads which are approximately parallel to the beam axis, the contact leads being positioned to straddle the forward edge of the circuit board and connected planarly to conductive pads spaced along a forward margin of the circuit board.

21. A module according to claim 19 in which the circuit board includes at least one contact pin connected planarly to conductive pad on a rearward margin of the circuit board so as to protrude rearward approximately parallel to the beam axis through the back panel to form an first external electrical contact at the second end of the cavity, the first contact being coupled to a first polarity of the laser driver circuit.

22. A module according to claim 20 in which the housing is formed of a conductive material and the back panel is formed of an insulative material such that the first external electrical contact is isolated from the housing, the housing being coupled to a second polarity of the laser driver circuit to form a second external electrical contact.

23. A self-contained laser module comprising:
   a cylindrical housing;
   a diode laser and laser driver circuit integrally mounted within the housing;
   a first end of the housing including means for emitting a collimated laser beam from the housing along an axis thereof;
   a first external electrical contact means positioned on a side of the cylindrical housing for radially contacting the housing;
   a second end including a second external electrical contact means positioned for axially contacting the housing; and
   means for coupling first and second electrical potentials from first and second contact means to the diode laser and laser driver circuit.

* * * * *